United States Patent
Hong et al.

(10) Patent No.: US 12,207,447 B2
(45) Date of Patent: Jan. 21, 2025

(54) HEAT SINK AND COMMUNICATION DEVICE

(71) Applicant: HUAWEI TECHNOLOGIES CO., LTD., Guangdong (CN)

(72) Inventors: Yuping Hong, Dongguan (CN); Xiaowei Hui, Dongguan (CN); Meng Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 134 days.

(21) Appl. No.: 18/151,566

(22) Filed: Jan. 9, 2023

(65) Prior Publication Data
US 2023/0156970 A1    May 18, 2023

Related U.S. Application Data

(63) Continuation of application No. PCT/CN2021/104337, filed on Jul. 2, 2021.

(30) Foreign Application Priority Data

Jul. 10, 2020 (CN) .......................... 202010663973.9

(51) Int. Cl.
*H05K 7/20* (2006.01)
(52) U.S. Cl.
CPC ..... *H05K 7/20509* (2013.01); *H05K 7/20318* (2013.01)
(58) Field of Classification Search
CPC ... H01L 23/427; H01L 23/473; H01L 23/367; H01L 2023/4043; H01L 2023/4062;
(Continued)

(56) References Cited

U.S. PATENT DOCUMENTS 10,032,693 B2 * 7/2018 Krivonak ................. B23K 1/00
10,119,766 B2 * 11/2018 Lin ........................ F28D 15/046
(Continued)

FOREIGN PATENT DOCUMENTS

CN 201828175 U 5/2011
CN 103363499 A 10/2013
(Continued)

OTHER PUBLICATIONS

Extended European Search Report for Application No. 21837562.4 dated Nov. 24, 2023, 8 pages.
(Continued)

*Primary Examiner* — Mandeep S Buttar (57) ABSTRACT

A heat sink is provided. The heat sink includes a base board and a rib board. The base board includes a base board cavity, and the rib board includes a rib board cavity. The base board includes a first board face and a second board face. A groove is disposed on the second board face. The base board cavity is filled with a liquid working medium. The rib board includes at least one partition board. The at least one partition board separates the rib board cavity into at least two chambers. The at least two chambers are separately connected to the base board cavity. One end of the rib board is inserted in the base board through the groove. One end of the partition board is located in the base board. A communication device that includes the heat sink is also provided.

17 Claims, 9 Drawing Sheets

(58) Field of Classification Search
CPC .............. F28D 15/0233; F28D 15/04; F28D 2021/0029; F28D 2021/0028; F28F 2215/06; F28F 3/048; F28F 3/02; F28F 3/06; F28F 3/04; F28F 1/02; F28F 3/12; F28F 3/14; H05K 7/20309; H05K 7/2029; H05K 7/20154; G06F 1/20; G06F 1/18
USPC ........................................................ 361/700
See application file for complete search history.

(56) References Cited

U.S. PATENT DOCUMENTS

| | | | | |
|---|---|---|---|---|
| 2002/0118511 | A1* | 8/2002 | Dujari | H01L 23/427 174/16.3 |
| 2004/0118550 | A1* | 6/2004 | Turocy | F28F 3/04 257/E23.102 |
| 2008/0062651 | A1* | 3/2008 | Reis | H01L 23/427 361/710 |
| 2009/0213543 | A1* | 8/2009 | Nemoz | H05K 7/20563 361/694 |
| 2012/0120604 | A1* | 5/2012 | Hao | F28D 15/00 165/104.21 |
| 2014/0131011 | A1* | 5/2014 | Kim | H05K 7/20481 165/104.19 |

FOREIGN PATENT DOCUMENTS

| | | |
|---|---|---|
| CN | 103837025 A | 6/2014 |
| CN | 205482497 U | 8/2016 |
| CN | 106643245 A | 5/2017 |
| CN | 106885485 A | 6/2017 |
| CN | 110473850 A | 11/2019 |

OTHER PUBLICATIONS

Chinese Office Action for Application No. 202010663973 dated Aug. 19, 2024, 7 pages.
Chinese Office Action for Application No. 202010663973 dated Nov. 11, 2024, 6 pages.

* cited by examiner

HEAT SINK AND COMMUNICATION DEVICE

CROSS-REFERENCE TO RELATED APPLICATIONS

This application is a continuation application of International Patent Application No. PCT/CN2021/104337, filed on Jul. 2, 2021, which claims priority to Chinese Patent Application No. 202010663973.9, filed on Jul. 10, 2020. The disclosures of the aforementioned applications are hereby incorporated by reference in their entireties.

TECHNICAL FIELD

This application relates to the field of heat dissipation technologies, and in particular, to a heat sink and a communication device.

BACKGROUND

A radio remote unit (RRU) of a mobile communication base station, a large-scale multiple-input multiple-output antenna (massive multiple-input multiple-output antenna, Massive MIMO Antenna), and the like face a challenge of heat dissipation for high power and high heat density with a continuous increase of transmit power and integration. To ensure a reliable operation in various outdoor harsh environments such as ice, snow, heat, wind, sand, and salt fog, this type of device usually uses fan-free natural heat dissipation, thereby avoiding shutdown of the base station in an overheat condition caused due to a fan failure.

Currently, a heat dissipation solution of the base station is generally disposing a heat sink on one side or two sides of a tank of the base station. The heat sink may be obtained through extruding or die-casting processing and then be connected to the tank. Alternatively, the tank and the heat sink may be directly obtained through die-casting. A heat emitting component of the base station such as a power amplifier or another component from which heat is to be dissipated such as an intermediate frequency processing chip, a baseband processing chip, and a power supply are attached to a base board of the heat sink and transfer heat to the heat sink. Then the heat is dissipated to an external environment through natural convection and heat radiation. Natural heat dissipation has a low heat exchange level of convection. Higher heat consumption of the base station requires a larger volume of the heat sink. An increase of the volume of the heat sink causes a problem of a heavy weight and high air resistance, and brings about difficulty in carrying and installation. Therefore, improving a heat dissipation capability of a unit volume of the heat sink and reducing a weight of the heat sink are key requirements for improving installation and deployment of mobile communication base stations.

SUMMARY

According to a first aspect, this application provides a heat sink. The heat sink mainly includes a base board and one or more rib boards. The base board includes a base board cavity. The base board includes a first board face and a second board face. The second board face is provided with a plurality of grooves. The plurality of grooves are disposed in one-to-one correspondence with the one or more rib boards. A liquid working medium is filled in the base board cavity. The rib board includes a rib board cavity. Each rib board is inserted in the base board cavity through a groove corresponding to the rib board. Each rib board includes at least one partition board. The at least one partition board separates the rib board cavity into at least two chambers along a first direction. One end of the partition board is located in the base board cavity. The at least two chambers are separately connected to the base board cavity.

For the heat sink in this embodiment of this application, when the component from which heat is to be dissipated generates heat, the base board of the heat sink is heated, at least a part of the liquid working medium in the base board cavity is evaporated to a vapor working medium, and the vapor working medium enters each chamber of the rib board cavity of at least one of the one or more rib boards. In addition, a part that is of the one or more rib boards and that is exposed in an external environment exchanges heat with an external medium, so that the vapor working medium inside the rib board is condensed into the liquid working medium. The liquid working medium obtained after condensing is refluxed along at least one partition board in the rib board to an end that is of the rib board and that is close to the component from which heat is to be dissipated, and may flow into the base board cavity. In addition, due to a flow guide function of the partition board in the rib board, the liquid working medium may return to each region position of the base board, to help implement efficient two-phase even heat dissipation of the heat sink.

In a possible implementation, a board face of the rib board may be further provided with a plurality of openings. The plurality of openings are disposed at an end part that is of the rib board and that is inserted in the base board cavity. In this way, each chamber obtained through separation implemented by using the partition board can be connected to the base board cavity through the openings. The liquid working medium condensed by using the rib board may also be refluxed to the base board cavity by using the openings.

In a possible implementation, an included angle between the partition board and a gravity direction is greater than or equal to 1° and less than or equal to 90°. For example, the included angle between the partition board and the gravity direction may be set to greater than or equal to 45° and less than or equal to 85°. In this way, after the vapor working medium is condensed into the liquid working medium at an end that is of the rib board and that is in the external environment, the liquid working medium can be refluxed along the partition board to the end that is of the rib board and that is close to the component from which heat is to be dissipated. In addition, the partition board may be made of a metal material, to increase a heat dissipation area of the rib board and improve heat dissipation efficiency.

In a possible implementation, to increase a heat exchange area of the rib board, a rib plate may further be disposed on an external surface that is of the rib board and that is exposed to the external environment. The rib plate may be fixed to the rib board in a plurality of forms such as welding, bonding, or perforated expansion joint. In addition, a quantity of rib plates disposed on each rib board may be selected according to a specific heat dissipation requirement.

In a possible implementation, a plurality of rib boards may be disposed on the base board of the heat sink, and the plurality of rib boards may be disposed side by side at intervals. An included angle between an arrangement direction of the plurality of rib boards and the gravity direction is 90°, or an included angle between an arrangement direction of the plurality of rib boards and the gravity direction is greater than or equal to 10° and less than 90°.

In addition, the plurality of rib boards may be in a V-shaped layout. Alternatively, the plurality of rib boards are in an inverted V-shaped layout, or the plurality of rib boards are in a W-shaped layout.

In a possible implementation, when the base board is specifically disposed, a liquid injection opening may be disposed at an end part of the base board. The liquid injection opening may be used to vacuumize a cavity of the heat sink assembled by using the base board and the rib board, and inject a working medium.

In a possible implementation, a combining groove may further be disposed on an inner surface of the first board face of the base board, and the combining groove may be designed based on an arrangement position of the component from which heat is to be dissipated. In addition, a quantity of combining grooves may be but is not limited to the same as a quantity of components from which heat is to be dissipated. In this case, the combining grooves may be disposed in one-to-one correspondence with the components from which heat is to be dissipated. In this way, after passing through the combining groove, the liquid working medium can more effectively converge into a region for disposing the component from which heat is to be dissipated, to enhance local evaporation phase change heat transfer of the component from which heat is to be dissipated.

In a possible implementation, a groove edge of the combining groove may further be a protrusion structure, and an end part that is of the rib board and that is inserted in the base board cavity may be provided with an opening. In this case, the protrusion structure may be inserted in the opening, so that the liquid working medium is condensed by using the rib board and then converges into the combining groove through the opening. In addition, an end face of the rib board may further fit the inner surface of the first board face of the base board.

In addition, a capillary flow guide structure may be further disposed on the inner surface of the first board face of the base board. For example, the structure may be at least one of a thin wire mesh, a thin groove, sintered powder, or the like.

In a possible implementation, a column may further be disposed on the inner surface of the first board face of the base board. One end that is of the column and that is away from the first board face may be connected to the second board face of the base board (for example, connected in a welding or bonding manner), to implement functions of fixing and connecting the two board faces of the base board, thereby improving structural stability of the base board. The column may be formed in an integrated molding manner at the same time when the first board face is manufactured, or may be independently manufactured and then disposed on the first board face in a welding manner or the like.

According to a second aspect, this application further provides a communication device. The communication device includes a component from which heat is to be dissipated and the heat sink in the first aspect. A base board of the heat sink is in contact with a part of or all of the component from which heat is to be dissipated.

In the communication device in this embodiment of this application, when the component from which heat is to be dissipated generates heat, the base board of the heat sink is in contact with the component from which heat is to be dissipated, a liquid working medium in a base board cavity absorbs the heat and becomes the vapor working medium, and the vapor working medium enters each chamber of a rib board through an opening of the rib board. In addition, a part that is of the rib board and that is exposed in an external environment exchanges heat with an external medium, so that the vapor working medium inside the rib board is condensed into the liquid working medium.

In addition, a partition board is disposed in the rib board, and the vaporized working medium enters each chamber of the rib board under a flow guide function of the partition board. The partition board may be used to control even distribution of the vaporized working medium, to help implement efficient two-phase even heat dissipation of the heat sink in a gravity direction and implement stable heat dissipation of the component from which heat is to be dissipated in each region. It may be understood that a liquid height of the liquid working medium in the base board may be adjusted according to arrangement, in the gravity direction, of the component from which heat is to be dissipated. This helps lower a liquid filling height of the liquid working medium in the base board, to enlarge steam space for heat exchange, thereby improving heat exchange efficiency and improving heat dissipation performance. On this basis, a volume of the heat sink can be reduced while a heat dissipation requirement of the communication device is met. In addition, as the liquid filling height is lowered, a weight of the heat sink can be effectively reduced, to reduce the costs.

REFERENCE NUMERALS

1. Heat sink 101. Base board 1011. First board face 10111. Combining groove 10112. Column
10113. Capillary flow guide structure 1012. Second board face 10121. Groove 10122. Fixing part 1013. Liquid injection opening
102. Rib board 1021. Partition board 1022. Chamber 1023. Opening 2. Communication device 201. Tank 202. Component from which heat is to be dissipated

DESCRIPTION OF EMBODIMENTS

To make objectives, technical solutions, and advantages of this application clearer, the following further describes this application in detail with reference to the accompanying drawings.

Terms used in the following embodiments are merely intended to describe particular embodiments, but are not intended to limit this application. Terms "one", "a", "the foregoing", "the", and "the one" of singular forms used in this specification and the appended claims of this application are also intended to include plural forms like "one or more", unless otherwise specified in the context clearly.

Reference to "an embodiment", "some embodiments", or the like described in this specification indicates that one or more embodiments of this application include specific features, structures, or features described with reference to the embodiments. Therefore, statements such as "in an embodiment", "in some embodiments", "in some other embodiments", and "in other embodiments" that appear at different places in this specification do not necessarily mean referring to a same embodiment. Instead, the statements mean "one or more but not all of embodiments", unless otherwise specifically emphasized in another manner. The terms "include", "contain", "have", and their variants all mean "include but are not limited to", unless otherwise specifically emphasized in another manner.

For ease of understanding a heat sink provided in the embodiments of this application, the following first describes an application scenario of the heat sink. Currently, heat dissipation is usually implemented for a base station in a manner of disposing a heat sink on one side or two sides of a tank of the base station. The heat sink may be obtained through extruding or die-casting processing and then be connected to the tank. Alternatively, the tank and the heat sink may be directly obtained through die-casting. A heat emitting component of the base station such as a power amplifier and a component from which heat is to be dissipated such as an intermediate frequency processing chip, a baseband processing chip, and a power supply are attached to a base board of the heat sink and transfer heat to the heat sink. Then the heat is dissipated to an external environment through natural convection and heat radiation. However, natural heat dissipation has a low heat exchange level of convection. Higher heat consumption of the base station requires a larger volume of the heat sink. An increase of the volume of the heat sink causes a problem of a heavy weight and high air resistance, and brings about difficulty in carrying and installation.

The base board of the heat sink is generally vertically arranged in parallel to a gravity direction according to a hardware form and a layout of the base station. If the base station is tilted for installation due to a factor of a mounting kit or a tilt coverage requirement for signal transmission (usually within a tilt angle of) 15°, a specific included angle is formed between the base board of the heat sink and the gravity direction. Components from which heat is to be dissipated in the base station are arranged evenly or unevenly from the bottom to the top along a height direction of the base board.

In addition, the heat sink is usually processed by using metal materials such as aluminum and copper. Aluminum is a most commonly used material for the heat sink because of its low density and good anticorrosion performance. A coefficient of heat conductivity of the metal material is limited. A coefficient of heat conductivity of aluminum is 180 W/(mK), and a coefficient of heat conductivity of copper is 400 W/(mK). When the heat sink reaches a specific size, heat conductivity of the heat sink becomes a bottleneck. Especially, when the components from which heat is to be dissipated are installed at high power density on the heat sink, a heat conduction temperature difference of ten to dozens of degrees is generated due to heat conduction of the heat sink. The temperature difference is not enough for heat exchange with air in the external environment.

The heat sink provided in this embodiment of this application aims to resolve the foregoing problem, to improve heat conductivity of the heat sink. The following describes a welding structure in this application in detail with reference to the accompanying drawings.

Figure 1:
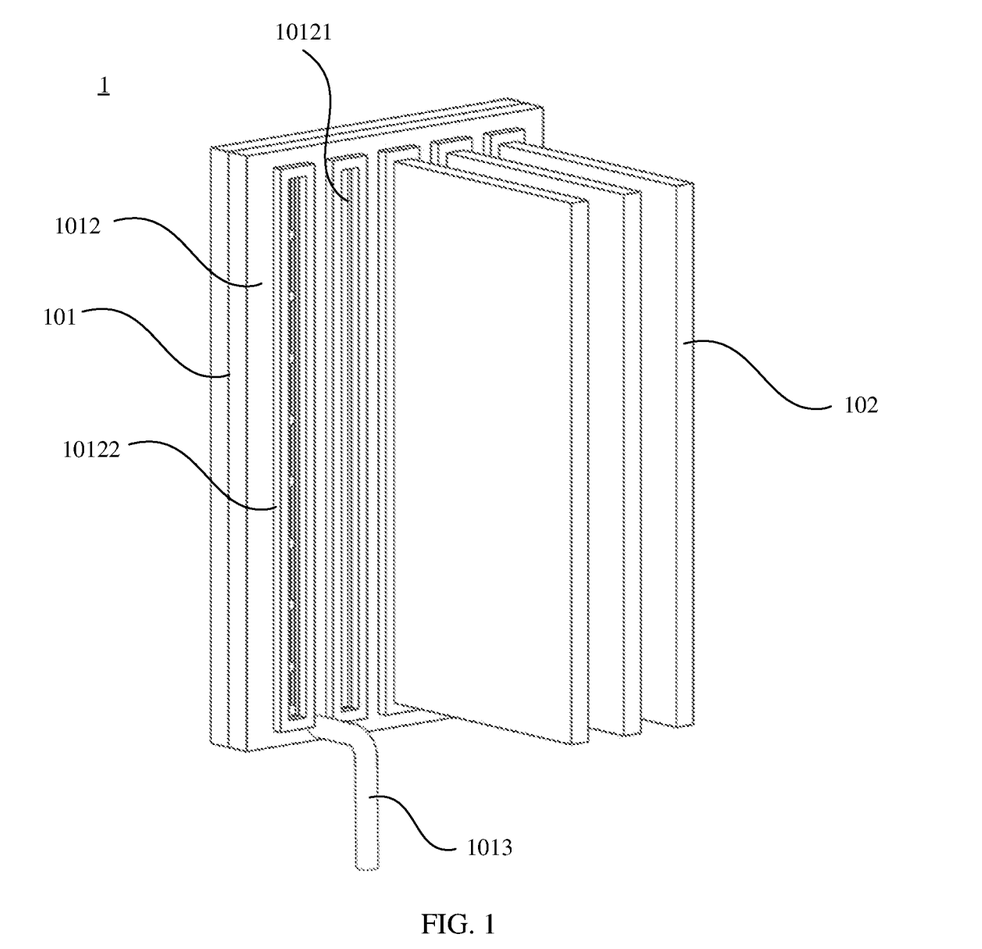
FIG. 1 is a schematic diagram of a structure of a heat sink according to an embodiment of this application.

With reference to FIG. 1, in an embodiment provided in this application, a heat sink 1 includes a base board 101 and a rib board 102. The base board 101 includes a base board cavity. The base board 101 has a first board face 1011 (this is not shown in FIG. 1, and reference may be made to FIG. 2) and a second board face 1012 that are disposed opposite to each other. The first board face 1011 may be used to be in contact with a component from which heat is to be dissipated (not shown in FIG. 1). The second board face 1012 may be provided with a plurality of grooves 10121. A liquid working medium is filled in the base board cavity. The liquid working medium may be but is not limited to water, a refrigerant, an inert fluorinated liquid, or an alcohol. Still with reference to FIG. 1, the rib board 102 includes a rib board cavity. One end of the rib board 102 may be inserted in the base board cavity through a groove 10121 that corresponds to the rib board 102 and that is at the second board face 1012 of the base board 101. All or a part of an end face of the end that is of the rib board 102 and that is inserted in the base board 101 may abut against an inner surface of the first board face 1011 of the base board 101. It may be understood that a gap may exist between the end face of the rib board 102 and the inner surface of the first board face 1011 due to an error. In addition, the base board 101 and the rib board 102 may be two separately manufactured parts. After the rib board 102 is inserted in the base board 101, the rib board 102 and the base board 101 may be fixed in a manner such as welding (for example, welding is performed on an outer surface of the base board, or welding is performed on the end of the inserted part of the rib board and the inner surface of the base board).

In addition, the rib board 102 may be fixedly connected to the base board 101. For example, with reference to FIG. 1, a fixing part 10122 protruding from the second board face 1012 may be disposed around the groove 10121. The fixing part 10122 may be but is not limited to a ring structure. In this way, side faces that are of the rib board 102 and the fixing part 10122 and that are opposite to each other may be connected in a bonding or welding manner. When a board face of the rib board 102 is connected to the fixing part 10122, a sealing requirement between the rib board 102 and the base board 101 may be further met through adjusting an amount of an adhesive or solder. In some other embodiments, a sealing structure may alternatively additionally be disposed (a sealing ring is disposed or glue dispensing is performed) between the rib board 102 and the base board 101 to meet the sealing requirement between the rib board 102 and the base board 101.

Still with reference to FIG. 1, in this embodiment, a shape of the groove 10121 on the base board 101 may be but is not limited to a strip groove, so that the base board 101 is provided with a relatively large quantity of grooves 10121 to dispose a relatively large quantity of rib boards 102. In addition, a shape of a contour of the groove 10121 may match a contour of an end part that is of the rib board 102 and that is used for fixing to the base board 101. In the heat sink 1 formed through inserting the rib board 102 into the base board 101, the rib board cavity is connected to the base board cavity. Therefore, when the liquid working medium in the base board 101 is evaporated to the vapor working medium after being heated, the vapor working medium can enter the rib board cavity to exchange heat with the environment by using the rib board 102. In this way, the heat sink 1 implements heat dissipation for the component from which heat is to be dissipated.

Figure 2:
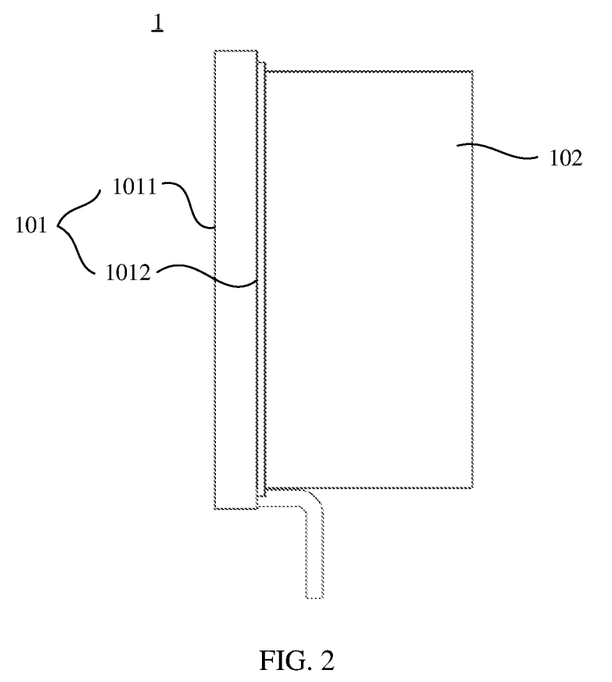
FIG. 2 is a schematic diagram of a structure of a heat sink according to another embodiment of this application.

With reference to FIG. 1 and FIG. 2, when the base board 101 is specifically disposed, the base board 101 may be in a regular shape, for example, a cuboid; or the base board 101 may be in an irregular shape, for example, a polyhedron. The base board 101 may be made of a metal such as copper or aluminum, or the base board 101 may be made of a nonmetal with relatively good heat dissipation performance such as ceramic or plastic. In addition, a liquid injection opening 1013 may be disposed at one end part of the base board 101. The liquid injection opening 1013 may be used to vacuumize a cavity of the heat sink 1 assembled by using the base board 101 and the rib board 102, and inject a working medium.

Figure 3:
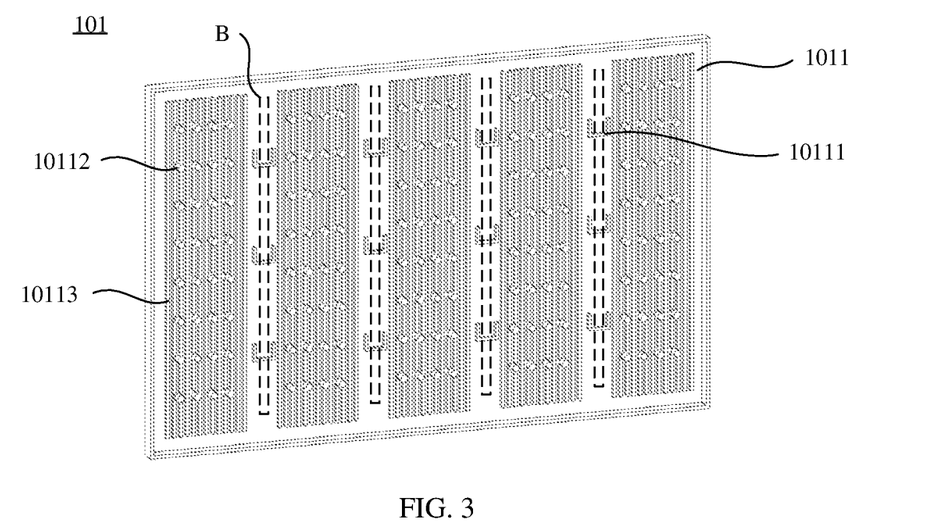
FIG. 3 is a schematic diagram of a structure of a base board according to an embodiment of this application.

In addition, FIG. 3 is a schematic diagram of an inner structure of the base board 101. A combining groove 10111 may further be disposed on the inner surface of the first board face 1011 of the base board 101, and the combining groove 10111 may be designed based on an arrangement position of the component from which heat is to be dissipated. In this way, after passing through the combining groove, the liquid working medium can more effectively converge into a region for disposing the component from which heat is to be dissipated, to enhance local evaporation phase change heat transfer of the component from which heat is to be dissipated.

In a possible embodiment of this application, a quantity of combining grooves 10111 may be but is not limited to the same as a quantity of components from which heat is to be dissipated. In this case, the combining grooves 10111 may be disposed in one-to-one correspondence with the components from which heat is to be dissipated. In this way, after passing through the combining groove 10111, the liquid working medium can more effectively converge into a region for disposing the component from which heat is to be dissipated, to enhance local evaporation phase change heat transfer of the component from which heat is to be dissipated.

Still with reference to FIG. 3, a column 10112 is disposed on the inner surface of the first board face 1011 of the base board 101. One end that is of the column 10112 and that is away from the first board face 1011 abuts against an inner surface of the second board face 1012 of the base board 101 (with reference to FIG. 2), to implement a support function for the two board faces of the base board 101, thereby improving structural stability of the base board 101.

It may be understood that when the column 10112 is disposed on the inner surface of the first board face 1011 of the base board 101, the column 10112 may be formed in an integrated molding manner with the first board face 1011, or may be fixed on the first board face 1011 in a welding or bonding manner or the like. In addition, when the column 10112 is disposed on the inner surface of the first board face 1011 of the base board 101, the rib board 102 may be inserted between two adjacent columns 10112.

In addition, a capillary flow guide structure 10113 may be further disposed on the inner surface of the first board face 1011 of the base board 101, to implement flow guide of the liquid working medium. For example, the capillary flow guide structure 10113 may be but is not limited to at least one of a thin wire mesh, a thin groove, sintered powder, or the like.

With reference to FIG. 1, in some embodiments of this application, when the rib board 102 is specifically disposed, the rib board 102 may include the rib board cavity. For example, the rib board 102 may be a flat structure, to facilitate disposing of a relatively large quantity of rib boards 102 on the base board 101, thereby improving heat dissipation performance of the heat sink 1. In addition, the rib board 102 may be made of a metal such as copper or aluminum, or the rib board 102 may be made of a nonmetal with relatively good heat dissipation performance such as ceramic or plastic.

Figure 4:
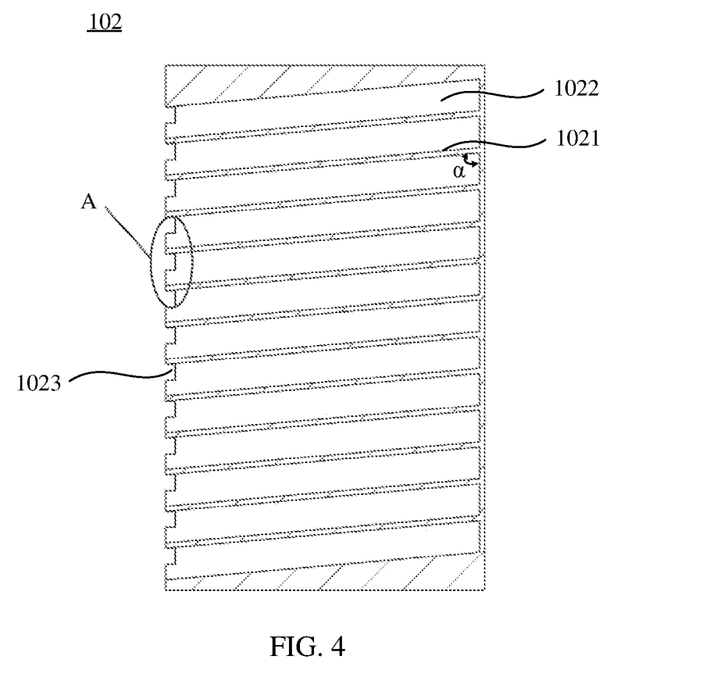
FIG. 4 is a schematic diagram of a structure of a rib board according to another embodiment of this application.

With reference to FIG. 4, at least one partition board 1021 is disposed in the rib board cavity. A quantity of partition boards 1021 may be, for example, one, two, three, or more. The partition board 1021 may be made of a metal with relatively good heat dissipation performance, or may be made of a nonmetal with relatively good heat dissipation performance, to increase a heat dissipation area of the rib board 102 and improve heat dissipation efficiency of the rib board 102. The one or more partition boards 1021 separate the rib board cavity into at least two chambers 1022. The at least two chambers 1022 may be separately connected to the base board cavity shown in FIG. 1. One end part of the partition board 1021 is located in the base board cavity. It may be understood that volumes of the chambers 1022 obtained through separating the rib board cavity by the partition board 1021 may be equal to or different from each other. The volumes of the chambers 1022 may be specifically set according to a distribution manner of the component from which heat is to be dissipated. In addition, when a plurality of partition boards 1021 are disposed in the rib board cavity, the plurality of partition boards 1021 may be disposed at intervals along a first direction, and the plurality of partition boards 1021 may be disposed in parallel or at a specified angle.

Specifically, when the partition board 1021 is disposed in the rib board cavity, the partition board 1021 and the rib board 102 may be an integrated molded structure formed through a one-time processing process. Alternatively, the rib board 102 and the partition board 1021 may be separately processed and manufactured, and the partition board 1021 and the rib board 102 are fixed by using a process such as welding or bonding.

Still with reference to FIG. 4, in some embodiments of this application, when the partition board 1021 is specifically disposed, a plane on which a board face of the partition board 1021 is located may be perpendicular to the gravity direction. In some other embodiments, an included angle α between the plane on which the board face of the partition board 1021 is located and the gravity direction may be greater than or equal to 1° and less than or equal to 90°. For example, the included angle α may be greater than or equal to 45° and less than or equal to 85°. In this way, after the vapor working medium is condensed into the liquid working medium at the end that is of the rib board 102 and that is in the external environment, the liquid working medium can be refluxed along the partition board 1021 to the end that is of the rib board 102 and that is close to the component from which heat is to be dissipated.

With reference to FIG. 4, the board face of the rib board 102 may be further provided with a plurality of openings 1023. The plurality of openings 1023 are disposed at an end part that is of the rib board 102 and that is inserted in the base board cavity. In this way, each chamber 1022 obtained through separation performed by using the partition board 1021 can be connected to the base board cavity shown in FIG. 1 through the openings 1023. It may be understood that, in this embodiment of this application, the plurality of openings 1023 may be disposed on one board face of the rib board 102, or may be disposed on a plurality of board faces of the rib board 102. The plurality of openings 1023 may be evenly distributed, or may be unevenly distributed. A shape of the opening 1023 may be a regular shape such as a circle, a rectangle, or a polygon; or may be an irregular shape such as an irregular hole.

Figure 5:
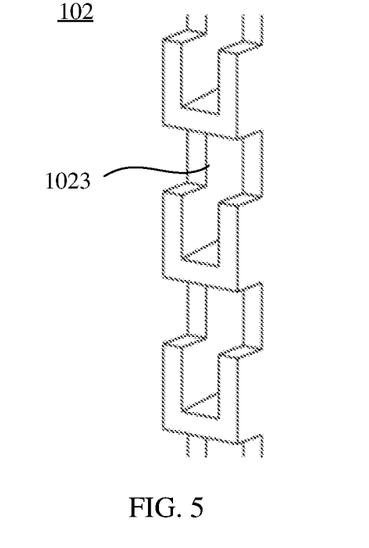
FIG. 5 is a locally enlarged diagram of a structure of A in FIG. 4.

FIG. 5 shows a disposing manner of the opening 1023 according to an embodiment of this application. In this embodiment, the opening 1023 may be obtained through cutting three adjacent board faces of the end part of the rib board 102, and each chamber 1022 of the rib board 102 shown in FIG. 4 is correspondingly provided with at least one opening 1023. In this way, a forming process of the opening 1023 can be effectively simplified, and a structure of the rib board 102 is relatively simple.

Still with reference to FIG. 5, because the rib board cavity may be connected to the base board cavity through inserting the rib board 102 in the end of the base board 101 shown in FIG. 1, in some embodiments of this application, the end part that is of the chamber 1022 of the rib board 102 shown in FIG. 4 and that is close to the component from which heat is to be dissipated may be in a fully open state, to help improve efficiency of conversion between the liquid working medium and the vapor working medium in the heat sink 1, thereby improving heat dissipation performance of the heat sink 1.

In some other embodiments of this application, with reference to both FIG. 3 and FIG. 4, when the end part that is of the rib board 102 and that is inserted in the base board cavity is provided with the openings 1023, a groove edge of the combining groove 10111 may further be a protrusion structure. In this case, the protrusion structure may be inserted in the opening 1023, so that the liquid working medium is condensed by using the rib board 102 and then converges into the combining groove 10111 through the opening 1023. With reference to FIG. 3, an insertion position of each rib board may be in a B region shown in the figure. In other words, the B region between the capillary flow guide structures on the first board face of the base board may abut against the inserted rib board.

In each embodiment of this application, with reference to FIG. 1 or FIG. 2, a part that is of the rib board 102 and that is exposed to the environment may be in contact with a heat exchange medium such as external air, water, or a non-flammable organic working medium, to implement natural convection, forced convection, or heat dissipation through radiation. In a possible embodiment of this application, a rib plate (not shown in the figure) may be further processed on an outer surface of the part that is of the rib board 102 and that is exposed to the environment, to increase a heat exchange area of the heat sink 1. In addition, the rib plate may be fixed to the rib board 102 in a plurality of forms such as welding, bonding, or perforated expansion joint.

Figure 6:
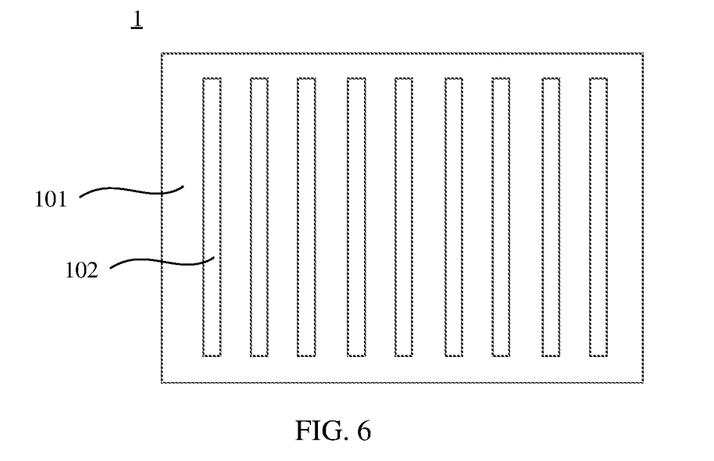
FIG. 6 is a schematic diagram of a structure of a heat sink according to another embodiment of this application.
Figure 7:
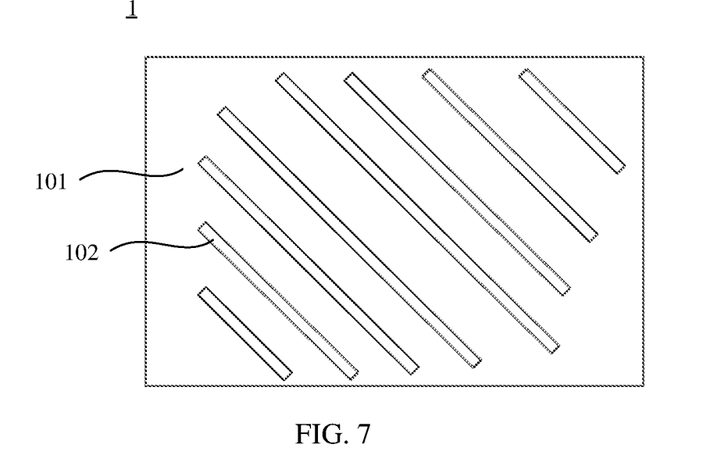
FIG. 7 is a schematic diagram of a structure of a heat sink according to another embodiment of this application.
Figure 8:
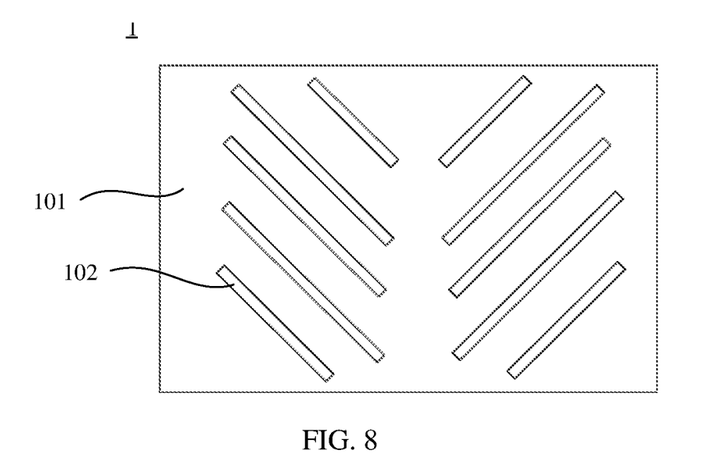
FIG. 8 is a schematic diagram of a structure of a heat sink according to another embodiment of this application.
Figure 9:
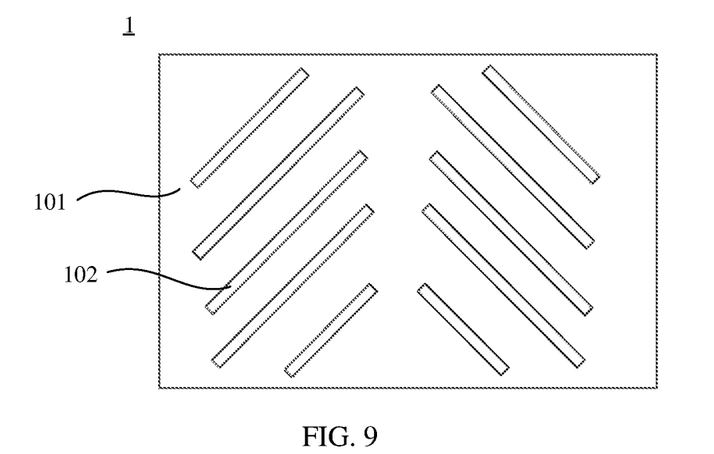
FIG. 9 is a schematic diagram of a structure of a heat sink according to another embodiment of this application.
Figure 10:
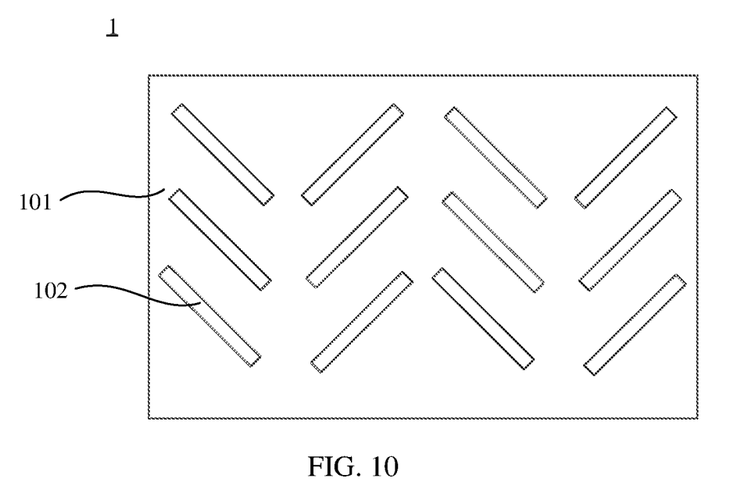
FIG. 10 is a schematic diagram of a structure of a heat sink according to another embodiment of this application.

With reference to FIG. 6, in the heat sink 1 in this embodiment of this application, there may be one or more rib boards 102. The quantity of rib boards 102 may be selected according to a quantity and a distribution manner of the components from which heat is to be dissipated. In addition, still with reference to FIG. 6, when there are a plurality of rib boards 102, the plurality of rib boards 102 may be disposed side by side at intervals. An included angle between an arrangement direction of the plurality of rib boards 102 and the gravity direction is 90°. In addition, distances between any two adjacent rib boards 102 may be the same or may be different. The plurality of rib boards 102 may have the same length or different lengths. The length may be set according to a heat dissipation requirement of the component from which heat is to be dissipated. The foregoing arrangement manner of the rib boards 102 in FIG. 6 is merely an example description provided in a possible embodiment of this application. In some other embodiments of this application, the rib boards 102 may further be arranged in another arrangement manner. For example, with reference to FIG. 7, the included angle between the arrangement direction of the plurality of rib boards 102 and the gravity direction is greater than or equal to 10° and less than 90°. The plurality of rib boards 102 may have different lengths. For another example, in the embodiment shown in FIG. 8, the plurality of rib boards 102 are in a V-shaped layout. Further with reference to FIG. 9, the plurality of rib boards 102 are in an inverted V-shaped layout. Alternatively, as shown in FIG. 10, the plurality of rib boards 102 are in a W-shaped layout. A heat series impact of the rib boards 102 is alleviated by using a reasonable layout of the rib boards 102, to improve performance of heat exchange through condensing by using the rib boards 102.

With reference to FIG. 1 to FIG. 4, in the heat sink 1 in this embodiment of this application, when the component from which heat is to be dissipated generates heat, the liquid working medium in the base board cavity of the base board 101 of the heat sink 1 absorbs the heat and becomes the vapor working medium, and the vapor working medium enters each chamber 1022 of the rib board 102 through the opening 1023 of the rib board 102. In addition, the part that is of the rib board 102 and that is exposed in the external environment exchanges heat with an external medium, so that the vapor working medium inside the rib board is condensed into the liquid working medium. The liquid working medium obtained after condensing is refluxed along one or more partition boards 1021 in the rib board 102 to one end that is of the rib board 102 and that is close to the component from which heat is to be dissipated, and may flow into the base board cavity through the opening 1023 on the rib board 102. In addition, due to a flow guide function of the partition board 1021 in the rib board 102, the liquid working medium may return to each region position of the base board 101, to help implement efficient two-phase even heat dissipation of the heat sink 1. It may be understood that the heat sink 1 in this embodiment of this application may be used independently, or a plurality of heat sinks 1 may be connected in series for use. A serial connection manner of the heat sinks 1 may be but is not limited to a simple stack setting. Alternatively, the heat sinks 1 may form a series structure formed through welding, bonding, integrated processing, or the like.

Figure 11:
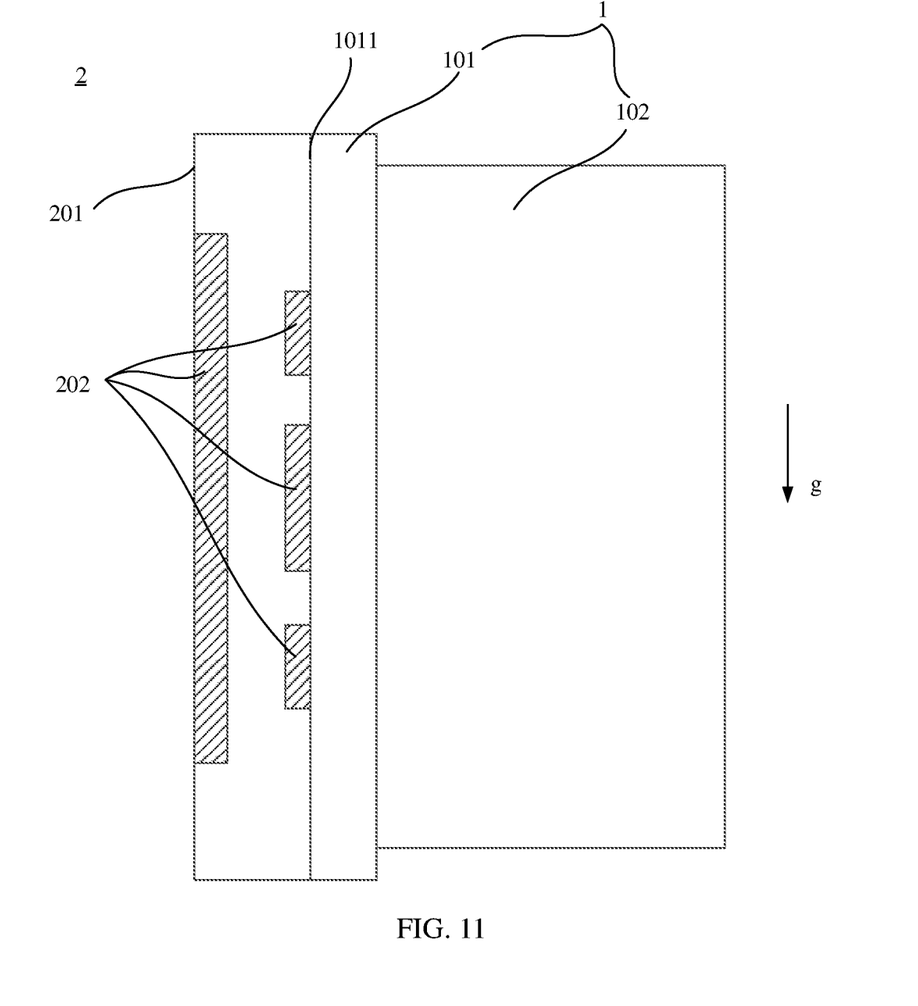
FIG. 11 is a schematic diagram of a structure of a communication device according to an embodiment of this application.

With reference to FIG. 11, based on the same inventive concept, this application further provides a communication device 2. The communication device 2 includes a component 202 from which heat is to be dissipated and the heat sink 1 in any one of the foregoing embodiments. The component 202 from which heat is to be dissipated may be but is not limited to a power amplifier, an intermediate frequency processing chip, a baseband processing chip, a TRX transmitter, a power supply, or the like.

The communication device 2 provided in this embodiment of this application may be but is not limited to a radio communication base station RRU, a multi-antenna MIMO base station, an outdoor independent baseband processing module, or an outdoor wired broadband access module. In addition to the foregoing communication device 2, the heat sink 1 in this application may also be used in a scenario in which heat dissipation needs to be performed for a power supply device or the like, for example, an outdoor power supply or a small solar photovoltaic inverter.

When the heat sink 1 in this embodiment of this application is used, a base board 101 of the heat sink 1 needs to be in contact (direct contact or indirect contact) with the component 202 from which heat is to be dissipated. Therefore, a position of disposing the heat sink 1 may be selected based on a distribution manner of the component 202 from which heat is to be dissipated. In some embodiments of this application, a plane on which a first board face 1011 of the base board 101 of the heat sink 1 is located may be parallel to a gravity direction, or a specified angle greater than 0° exists between a plane on which a first board face 1011 of the base board 101 of the heat sink 1 is located and a gravity direction.

With reference to FIG. 11, generally, the outdoor communication device 2, a power supply device, or the like has a relatively large volume. The communication device 2 is used as an example. To implement heat dissipation for the component 202 from which heat is to be dissipated in the communication device 2, the component 202 from which heat is to be dissipated may be disposed on an inner surface of a side board of a tank 201 of the communication device 2, and be arranged in the gravity direction. In this application scenario, the heat sink 1 may be fixed to an outer surface of the side board of the tank 201 of the communication device 2. In this case, the plane on which the first board face 1011 of the base board 101 of the heat sink 1 is located may be disposed in parallel to the gravity direction or disposed at an included angle greater than 0° and less than or equal to 90°. For example, the included angle may be greater than or equal to 5° and less than or equal to 15°. It may be understood that, in this embodiment, the rib board 102 is located in an upper part of the base board 101 in the gravity direction, so that the liquid working medium obtained after condensing by using the rib board 102 of the heat sink 1 is refluxed to the base board 101.

Figure 12:
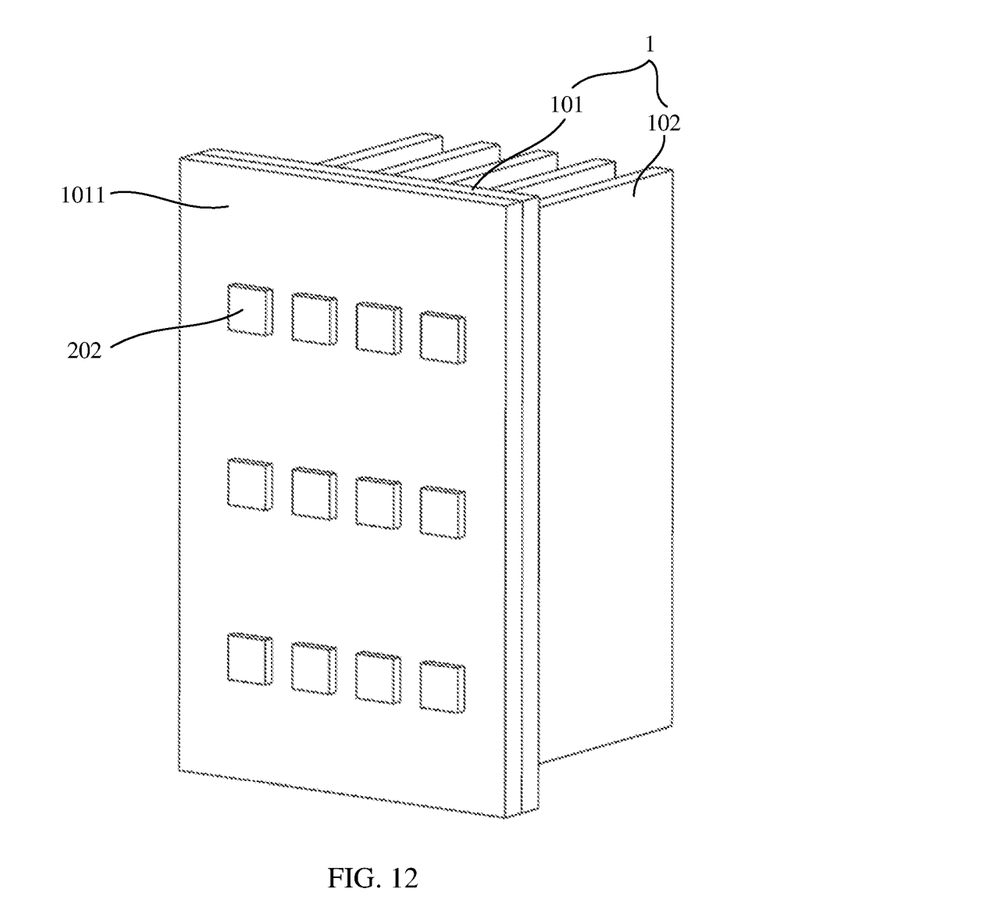
FIG. 12 is a schematic diagram of a structure of a heat sink according to another embodiment of this application.

With reference to FIG. 11, in some embodiments, the communication device 2 may include the tank 201, so that the heat sink 1 can be disposed in the tank 201. In addition, with reference to FIG. 12, in some embodiments of this application, the base board 101 of the heat sink 1 may further be used as a side board of the tank 201 of the communication device 2, to implement an integrated design between the communication device 2 and the base board 101. In this embodiment, the component 202 from which heat is to be dissipated may be directly fixed to the outer surface of the first board face 1011 of the base board 101, which helps improve heat exchange efficiency between the heat sink 1 and the component 202 from which heat is to be dissipated.

Figure 13:
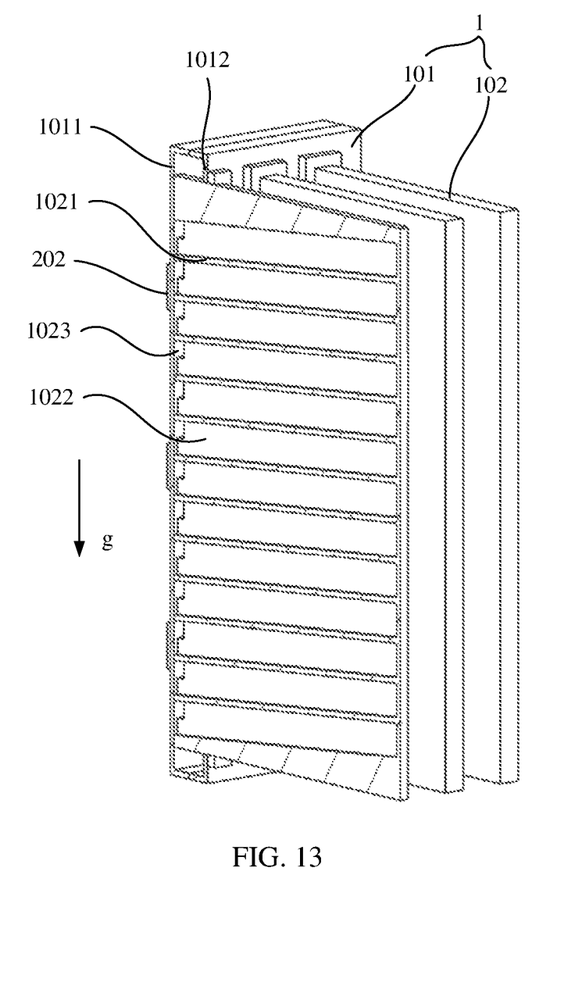
FIG. 13 is a schematic diagram of a structure of a heat sink according to another embodiment of this application.

With reference to FIG. 13, the plane on which the first board face 1011 of the base board 101 is located is parallel to the gravity direction. In this case, when the rib board 102 is specifically disposed, the partition board 1021 in the rib board cavity may be arranged in the gravity direction. In addition, the partition board 1021 may be tilted, so that the included angle between the plane on which the partition board 1021 is located and the gravity direction is greater than or equal to 1° and less than or equal to 90°. For example, the included angle may be greater than or equal to 45° and less than or equal to 85°. Therefore, the liquid working medium obtained after condensing by using the rib board 102 may be refluxed along the partition board 1021 to the end that is of the rib board 102 and that is close to the component 202 from which heat is to be dissipated.

In the communication device 2 in this embodiment of this application, when the component 202 from which heat is to be dissipated generates heat, the liquid working medium at the end (an evaporating end) that is of the heat sink 1 and that is close to the component 202 from which heat is to be dissipated absorbs heat to become the vapor working medium, and the vapor working medium enters each chamber 1022 of the rib board 102 through the opening 1023 of the rib board 102. In addition, a part (a condensing end) that is of the rib board 102 and that is exposed in the external environment exchanges heat with an external medium, so that the vapor working medium inside the rib board 102 is condensed into the liquid working medium.

Because there is a circulation channel for both the vapor working medium and the liquid working medium in each chamber 1022 of the rib board 102, an evaporating end and a condensing end of each chamber 1022 are at the same horizontal height, or have a small gravity gradient. In this way, the liquid working medium obtained through condensing at the condensing end of the rib board 102 is refluxed along one or more partition boards 1021 to the evaporating end of the rib board 102, and may be refluxed into the base board cavity through the opening 1023 on the rib board 102.

In addition, when heat dissipation is performed, by using the heat sink 1 in this embodiment of this application, on the component 202 from which heat is to be dissipated in the communication device 2, the component 202 from which heat is to be dissipated in a bottom region in the gravity direction heats the liquid working medium near the component 202, and heat dissipation may be performed by using the rib board 102 for the component 202 from which heat is to be performed in a middle region and an upper region, to avoid overheating. The partition board 1021 is disposed in the rib board 102, and the vaporized working medium enters each chamber 1022 of the rib board 102 under a flow guide function of the partition board 1021. The partition board 1021 may be used to control even distribution of the vaporized working medium, to help implement efficient two-phase even heat dissipation of the heat sink 1 in the gravity direction and implement stable heat dissipation of the component 202 from which heat is to be dissipated in each region. It may be understood that when a plane on which the first board face 1011 of the base board 101 is parallel to the gravity direction, a liquid height of the liquid working medium in the base board 101 may be adjusted according to arrangement, in the gravity direction, of the component 202 from which heat is to be dissipated. This helps lower a liquid filling height of the liquid working medium in the base board 101, to enlarge steam space for heat exchange, thereby improving heat exchange efficiency and improving heat dissipation performance. On this basis, a volume of the heat sink 1 can be reduced while a heat dissipation requirement of the communication device 2 is met. In addition, as the liquid filling height is lowered, a weight of the heat sink 1 can be effectively reduced, to reduce the costs.

For an extreme scenario in which heat consumption of the component 202 from which heat is to be dissipated in the middle region and heat consumption of the component 202 from which heat is to be dissipated in the upper region are far higher than heat consumption of the component 202 from which heat is to be dissipated in the bottom region, a power-on sequence of the components 202 from which heat is to be dissipated may be controlled by using software. For example, the component 202 from which heat is to be dissipated is heated first. Then, the component 202 from which heat is to be dissipated in the middle region and the component 202 from which heat is to be dissipated in the upper region are powered on when the working medium is refluxed to the component 202 from which heat is to be dissipated in the middle region and the component 202 from which heat is to be dissipated in the upper region.

In the foregoing embodiment, only the following application scenario is given: When the plane on which the first board face 1011 of the base board 101 is located is disposed in parallel to the gravity direction, the heat sink 1 performs heat dissipation on the component 202 from which heat is to be dissipated in the communication device 2. It may be understood that, in an application scenario in which the plane on which the first board face 1011 of the base board 101 is located needs to be disposed at a specified angle to the gravity direction, the heat sink 1 in FIG. 13 may be rotated by a corresponding angle as required. In this case, a manner of disposing the base board 101 or the rib board 102 is similar to that in the foregoing embodiment. Details are not described herein again.

To further understand the heat sink 1 in this embodiment of this application, with reference to FIG. 13, a method for manufacturing the heat sink 1 in this application is described by using an example in which materials of the base board 101 and the rib board 102 of the heat sink 1 are both aluminum.

First, a rectangular cavity is processed in a manner of stamping and forging or welding through an aluminum plate. The first board face 1011 of the rectangular cavity is used to be in contact with the component 202 from which heat is to be dissipated. There are a plurality of parallel strip grooves on the second board face of the rectangular cavity. The grooves may be processed in a stamping manner to form the base board shown in FIG. 13.

Then, an end of one or more flat aluminum tubes (the rib board 102) with parallel flow channels inside is inserted in the rectangular cavity of the base board 101 by using the strip groove, and is in mechanical contact with or is welded to an inner wall surface of the first board face 1011 of the rectangular cavity. An end part of an end that is of the flat aluminum tube and that is away from the rectangular cavity is sealed.

Then, a part that is of the flat aluminum tube and that is sandwiched between the inner wall surface of the first board face 1011 of the rectangular cavity and the inner wall surface of the second board face 1012 of the rectangular cavity is provided with an opening, so that the vapor working medium can subsequently enter the flat aluminum tube through the opening 1023. A position of the opening 1023 may be on one side or two sides of the flat aluminum tube. A shape of the opening 1023 may be circular, rectangular, hexagonal, or the like. Area distribution for disposing the opening 1023 at the flat aluminum tube may be uneven. One end may have a large area for the openings, and the other end may have a small area for the openings. The openings 1023 may alternatively be evenly distributed.

In addition, an included angle between parallel flow channels in the flat aluminum tube and the gravity direction is greater than or equal to 1° and less than or equal to 90°. For example, the included angle is greater than or equal to 45° and less than or equal to 85°. In one aspect, the angle may be formed through disposing the first board face 1011 of the rectangular cavity along the gravity direction. The parallel flow channels may be disposed at an included angle greater than or equal to 1° and less than or equal to 90° to the gravity direction. In addition, the first board face 1011 of the rectangular cavity may be further disposed at a specified angle to the gravity direction. The parallel flow channels and the first board face 1011 are vertically disposed to implement a requirement for an included angle greater than or equal to 1° and less than or equal to 90° between the parallel flow channels and the gravity direction. In this way, the liquid working medium in the flow channels of the flat aluminum tube may be refluxed along the parallel flow channels inside the flat aluminum tube to the inner wall surface of the first board face 1011 of the rectangular cavity under gravity.

Finally, the rectangular cavity and the flat aluminum tube are welded and sealed through vacuum brazing or continuous furnace brazing to form a heat sink. A liquid injection opening for vacuumizing and injection of a working medium may be reserved on the heat sink. The heat sink is vacuumized by using the liquid injection opening. A certain quantity of the liquid working medium is injected.

In some embodiments, the method for manufacturing a heat sink may further include disposing a combining groove on an inner wall surface of the rectangular cavity, so that the liquid working medium condensed by using the flat aluminum tube can converge in a region in which a component from which heat is to be dissipated and that requires heat dissipation.

In addition, a rib groove or a welding rib plate may be stamped on the inner wall surface of the first board face in contact with the component from which heat is to be dissipated in the rectangular cavity, to facilitate boiling heat exchange of the liquid working medium in the region for disposing the component from which heat is to be dissipated.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A heat sink, comprising a base board and one or more rib boards, wherein the base board comprises a base board cavity, and each rib board comprises a rib board cavity, wherein the base board comprises a first board face and a second board face, the second board face is provided with a plurality of grooves that are in one-to-one correspondence with the one or more rib boards, and a liquid working medium is filled in the base board cavity; one end of each rib board of the one or more rib boards is inserted in the base board cavity through a groove corresponding to the rib board, the base board cavity is connected to the rib board cavity of said each rib board, said each rib board comprises at least one partition board, the at least one partition board separates the rib board cavity into at least two chambers, one end of the at least one partition board is located in the base board cavity, and the at least two chambers are separately connected to the base board cavity; wherein the base board and the one or more rib boards are configured to enable a vapor working medium, produced by evaporation of at least a part of the liquid working medium in the base board cavity when the base board is heated, to enter the rib board cavity of at least one of the one or more rib boards; and the one or more rib boards are further configured to enable the vapor working medium to condense to become the liquid working medium again and then is refluxed to the base board cavity along the partition board;

wherein a board face of a rib board of the one or more rib boards is provided with a plurality of openings, and the plurality of openings are disposed at an end part that is of the rib board and that is inserted in the base board cavity; wherein a combining groove is disposed on an inner surface of the first board face of the base board and wherein a groove edge of the combining groove is a protrusion structure, the end part that is of the rib board and that is inserted in the base board cavity is provided with an opening, and the protrusion structure is inserted in the opening.

2. The heat sink according to claim 1, wherein a board face of a rib board of the one or more rib boards is provided with a plurality of openings, and the plurality of openings are disposed at an end part that is of the rib board and that is inserted in the base board cavity.

3. The heat sink according to claim 1, wherein the base board and the one or more rib boards are further configured to have, when the heat sink is arranged vertically in parallel to a gravity direction, an included angle between the at least one partition board and the gravity direction that is greater than or equal to 1° and less than or equal to 90°.

4. The heat sink according to claim 3, wherein the included angle between the at least one partition board and the gravity direction is greater than or equal to 45° and less than or equal to 85°.

5. The heat sink according to claim 1, wherein a rib plate is disposed on an external surface of a rib board of the one or more rib boards.

6. The heat sink according to claim 1, wherein the one or more rib boards comprise a plurality of rib boards arranged side by side at intervals, and when the heat sink is arranged vertically in parallel to a gravity direction, an included angle between an arrangement direction of the plurality of rib boards and the gravity direction is 90°, or an included angle between an arrangement direction of the plurality of rib boards and the gravity direction is greater than or equal to 10° and less than 90°; or the plurality of rib boards are in a V-shaped layout; or the plurality of rib boards are in an inverted V-shaped layout; or the plurality of rib boards are in a W-shaped layout.

7. The heat sink according to claim 1, wherein a quantity of combining grooves is the same as a quantity of components from which heat is to be dissipated, and the combining grooves are disposed in one-to-one correspondence with the components from which heat is to be dissipated.

8. The heat sink according to claim 1, wherein after being inserted in the base board cavity, each rib board abuts against an inner surface of the first board face.

9. The heat sink according to claim 1, wherein a capillary flow guide structure is further disposed on an inner surface of the first board face of the base board.

10. The heat sink according to claim 1, wherein a column is further disposed on an inner surface of the first board face of the base board.

11. The heat sink according to claim 10, wherein one end that is of the column and that is away from the first board face abuts against an inner surface of the second board face.

12. The heat sink according to claim 1, wherein a liquid injection opening is disposed at an end part of the base board.

13. A communication device, comprising a component from which heat is to be dissipated and a heat sink, wherein, the heat sink comprises: a base board and one or more rib boards, wherein the base board is in contact with the component from which heat is to be dissipated, wherein the base board comprises a base board cavity, and each rib board comprises a rib board cavity, wherein the base board comprises a first board face and a second board face, the second board face is provided with a plurality of grooves that are in one-to-one correspondence with the one or more rib boards, and a liquid working medium is filled in the base board cavity; one end of each rib board of the one or more rib boards is inserted in the base board cavity through a groove corresponding to the rib board, the base board cavity is connected to the rib board cavity of said each rib board, said each rib board comprises at least one partition board, the at least one partition board separates the rib board cavity into at least two chambers, one end of the at least one partition board is located in the base board cavity, and the at least two chambers are separately connected to the base board cavity; wherein the base board and the one or more rib boards are configured to enable a vapor working medium, produced by evaporation of at least a part of the liquid working medium in the base board cavity when the base board is heated, to enter the rib board cavity of at least one of the one or more rib boards; and the one or more rib boards are further configured to enable the vapor working medium to condense to become the liquid working medium again and then is refluxed to the base board cavity along the partition board;

wherein a board face of a rib board of the one or more rib boards is provided with a plurality of openings, and the plurality of openings are disposed at an end part that is of the rib board and that is inserted in the base board cavity; wherein a combining groove is disposed on an inner surface of the first board face of the base board and wherein a groove edge of the combining groove is a protrusion structure, the end part that is of the rib board and that is inserted in the base board cavity is provided with an opening, and the protrusion structure is inserted in the opening.

14. The communication device according to claim 13, wherein the base board and the one or more rib boards are further configured to have, when the heat sink is arranged vertically in parallel to a gravity direction, an included angle between the at least one partition board and the gravity direction that is greater than or equal to 1° and less than or equal to 90°.

15. The communication device according to claim 14, wherein the included angle between the at least one partition board and the gravity direction is greater than or equal to 45° and less than or equal to 85°.

16. The communication device according to claim 13, wherein a rib plate is disposed on an external surface of a rib board of the one or more rib boards.

17. The communication device according to claim 13, wherein the one or more rib board comprise a plurality of rib boards arranged side by side at intervals, and when the heat sink is arranged vertically in parallel to a gravity direction, an included angle between an arrangement direction of the plurality of rib boards and the gravity direction is 90°, or an included angle between an arrangement direction of the plurality of rib boards and the gravity direction is greater than or equal to 10° and less than 90°; or the plurality of rib boards are in a V-shaped layout; or the plurality of rib boards are in an inverted V-shaped layout; or the plurality of rib boards are in a W-shaped layout.

* * * * *